US010180591B2

(12) United States Patent
Lee et al.

(10) Patent No.: US 10,180,591 B2
(45) Date of Patent: Jan. 15, 2019

(54) DISPLAY DEVICE

(71) Applicant: LG ELECTRONICS INC., Seoul (KR)

(72) Inventors: Dongil Lee, Seoul (KR); Sangho Choi, Seoul (KR); Jungkyu Park, Seoul (KR); Myungwhun Chang, Seoul (KR); Sungwook Han, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/719,374

(22) Filed: Sep. 28, 2017

(65) Prior Publication Data
US 2018/0088398 A1 Mar. 29, 2018

(30) Foreign Application Priority Data
Sep. 28, 2016 (KR) .......................... 10-2016-0124649

(51) Int. Cl.
*G02F 1/1333* (2006.01)
*H05K 7/20* (2006.01)

(52) U.S. Cl.
CPC .. *G02F 1/133385* (2013.01); *G02F 1/133308* (2013.01); *H05K 7/202* (2013.01);
(Continued)

(58) Field of Classification Search
CPC ........... H05K 7/20972; H05K 7/20145; H05K 7/202; H05K 7/2039; H05K 7/20154;
(Continued)

(56) References Cited

U.S. PATENT DOCUMENTS

| 7,486,517 B2* | 2/2009 | Aapro | H04M 1/026 |
| | | | 165/104.33 |
| 2007/0081344 A1* | 4/2007 | Cappaert | G02B 6/0085 |
| | | | 362/373 |

(Continued)

FOREIGN PATENT DOCUMENTS

KR 1020120028075 3/2012

OTHER PUBLICATIONS

PCT International Application No. PCT/KR2017/010839, Written Opinion of the International Searching Authority dated Mar. 8, 2018, 14 pages.

*Primary Examiner* — Hung S. Bui
*Assistant Examiner* — Michael A Matey
(74) *Attorney, Agent, or Firm* — Lee, Hong, Degerman, Kang & Waimey PC

(57) ABSTRACT

There is disclosed a display device comprising a front case, a display panel spaced apart from the front case to define a first space therebetween, a backlight unit coupled to a rear surface of the display panel, a middle frame spaced apart from a rear surface of the backlight unit to define a second space therebetween, a rear case spaced apart from a rear surface of the middle frame to define a third space therebetween, wherein the rear case is coupled to the front case to enclose the first space, the second space, and the third space such that air is not permitted to flow between the first, second, and third spaces and an exterior of the display device, a closed cooling unit disposed such that air is permitted to flow between the closed cooling unit and the first, second, and third spaces, a closed heat exchange unit disposed at the rear case and configured such that air is permitted to flow between the closed heat exchange unit and the first, second, and third spaces via the closed cooling unit, an open heat exchange unit disposed at the rear case and configured such that air is permitted to flow between the (Continued)

open heat exchange unit and the exterior of the display device, wherein the open heat exchange unit is further configured to exchange heat with the closed heat exchange unit and an open cooling unit configured to exhaust air from the open heat exchange unit to the exterior of the display device.

15 Claims, 14 Drawing Sheets

(52) U.S. Cl.
CPC ............... *H05K 7/20145* (2013.01); *G02F 2001/133317* (2013.01)

(58) Field of Classification Search
CPC .......... H05K 7/20172; H05K 7/20954; H05K 7/20963; H05K 5/0017; H05K 5/0213; H05K 7/20; H05K 7/20136; H05K 7/20163; H05K 7/20209; H05K 7/20409; H05K 7/209; H05K 7/20909; H05K 1/0201; H05K 5/0217; H05K 5/03; H05K 7/20254; H05K 7/20336; H05K 7/20436; H05K 9/0032; H05K 9/0096; G02F 1/133385; G02F 1/133308; G02F 2001/133628; G02F 2001/13332; G02F 1/133382; G02F 2001/133342; G06F 1/206; G06F 1/1601; G06F 1/20; G06F 2200/201; G06F 1/1626; G06F 1/1616; G06F 1/1637

See application file for complete search history.

(56) References Cited

U.S. PATENT DOCUMENTS

| | | | |
|---|---|---|---|
| 2008/0285290 A1* | 11/2008 | Ohashi | G02B 6/0085 362/373 |
| 2009/0086430 A1* | 4/2009 | Kang | G02F 1/133385 361/695 |
| 2010/0177479 A1* | 7/2010 | Itazawa | H05K 7/20963 361/694 |
| 2011/0058326 A1* | 3/2011 | Idems | G09F 9/30 361/679.21 |
| 2011/0162831 A1 | 7/2011 | Lee et al. | |
| 2011/0167845 A1* | 7/2011 | Lee | H05K 7/20972 62/89 |
| 2011/0310315 A1* | 12/2011 | Yamaguchi | G06F 1/203 348/836 |
| 2012/0236499 A1* | 9/2012 | Murayama | H04N 5/64 361/696 |
| 2013/0194782 A1 | 8/2013 | Byun | |
| 2014/0334100 A1* | 11/2014 | Yoon | H05K 7/20145 361/692 |
| 2015/0075758 A1* | 3/2015 | Ishimaru | F28F 3/048 165/167 |
| 2015/0366101 A1 | 12/2015 | Dunn et al. | |
| 2016/0198589 A1* | 7/2016 | Kang | G02F 1/133385 361/692 |
| 2017/0172016 A1* | 6/2017 | Kang | G09F 9/33 |

\* cited by examiner

- PRIOR ART -

(a)          (b)

DISPLAY DEVICE

CROSS-REFERENCE TO RELATED APPLICATIONS

Pursuant to 35 U.S.C. § 119(a), this application claims the benefit of earlier filing date and right of priority to Korean Patent Application No. 10-2016-0124649, filed on Sep. 28, 2016, the contents of which are hereby incorporated by reference herein in its entirety.

BACKGROUND OF THE DISCLOSURE

Field of the Disclosure

Embodiments of the present disclosure relate to a display device which considers assembly and production efficiency and usability.

Background of the Disclosure

A display device is a general name for devices configured to output images. An image output method may be categorized into a method which facilitates direct light emitting of a panel element by using an organic light-emitting diode and another method which uses a liquid crystal panel and a backlight unit for irradiating light to the liquid crystal panel.

The latter method is applied so as to describe embodiments of the present disclosure. Unique technical features of the present disclosure may be applicable to both methods.

Heat is generated during the driving of the display device so that the display device may require a heat radiation structure configured to dissipate such heat effectively. Heat is generated not only in the liquid crystal panel and the backlight unit but also in the substrate in which electronic components for driving image output are loaded. Accordingly, heat radiation needs to be required by each configuration which generates heat.

The heat radiation structure of the display device may be categorized into two types based on whether external air is directly led into the device.

One type of the heat radiation structure having external air directly led into the display device may be used in indoor devices such as TVs and monitors so as to be relatively free from waterproof or dustproof.

In this instance, external air is drawn into the device and the air provided with the heat radiated from the device is released outside the device to perform heat radiation.

While, a structure for protecting the display panel and inner electronic components has to be put into consideration for an outdoor display device.

Middle-sized and large-sized display devices which are usually used outdoors have a relatively high brightness to secure a sufficient outdoor visibility. The display devices are likely to be neglected under high outdoor temperatures. Accordingly, heat generation of the display device becomes a big issue.

The heat radiation or dissipation to solve such the heat generation problem is realized in the display device in diverse ways. Main examples of the heat radiation structure include an air-cooling system and a water-cooling system. Also, there is a further contact method which uses a heat pipe.

Such the heat radiation cooling systems may be used exclusively. As occasion demands, two or more systems may be used combinedly.

The air cooling system out of the systems for cooling such the middle-and-large sized display devices mentioned above may include a direct cooling system configured to filter dust or inflow foreign substances, using a filter, while direct inflow of external air is allowed and an indirect cooling system configured to generate heat exchange between external air and internal air of the device, using a heat exchanger, while external air and internal air are basically shut off from each other.

The indirect cooling system has an advantage of easy ongoing maintenance that internal air is not mixed with external air and a disadvantage of additional expenses for a sealing process.

Such a disadvantage is likely to give a supplier, who assembles and manufactures the entire display devices after provided with display modules, a trouble in re-processing the provided display modules and a difficult sealing structure because of its structural complexity.

Accordingly, it is necessary to consider a structure for manufacturing final display devices by simplifying the sealing structure and minimizing the deformation of the display modules.

SUMMARY OF THE DISCLOSURE

Accordingly, an object of the present invention is to address the above-noted and other problems and to solve the complex sealing structure of the display device mentioned above.

Another object of the present disclosure is to manufacture a final display device by processing a supplied display module with the least deformation as possible.

Embodiments of the present disclosure may provide a display device comprising a front case; a display panel spaced a preset distance apart from a front surface of the front case enough to form a first space; a backlight unit coupled to a rear surface of the display panel; a middle frame spaced a preset distance apart from a rear surface of the backlight unit enough to form a second space and having electronic components loaded therein; a rear case spaced a preset distance apart from a rear surface of the middle frame enough to form a third space and coupled to the front case to partition off the first space, the second space and the third space from the outside airtight; a closed cooling unit provided in a predetermined region of the first space, the second space and the third space to have a front surface toward a region of each space; a closed heat exchange unit provided in the rear case to form a closed passage from the other region of the first space, the second space and third space to a rear surface of the closed cooling unit; an open heat exchange unit provided in the rear case to form a passage to the outside and configured to exchange heat with the closed heat exchange unit; and an open cooling unit provided between the open heat exchange unit and the outside to form air flow.

The display device may further comprise a guide chamber configured to guide the air drawn into the closed cooling unit dividedly to the first space and the second space.

The guide chamber may have an angled guide surface to make the width of the passage become narrower along a direction toward the first space from the closed cooling unit.

The display device may further comprise a hinge unit configured to couple the front case and the rear case to each other to allow the rear case to selectively open and close the front case; and a gas spring unit having one side coupled to an inner surface of the rear case and the other side coupled to the middle frame to provide a tensile force.

The display device may further comprise a fan bracket provided in the front case to guide a passage formed in a rear surface of the closed cooling unit; and at least one support wall formed in the fan bracket along an end of the fan bracket.

The display device may further comprise a fan bracket provided in the front case to guide a passage formed in a rear surface of the closed cooling unit; a lower duct hole provided in the rear case to guide the closed heat exchange unit and a passage formed in the fan bracket; and a fan bracket gasket provided in a predetermined region of the fan bracket to contact with the lower duct hole.

The display device may further comprise a gasket provided along a border with the front case to contact with an inner surface of the rear case.

The display device may further comprise a panel drive unit coupled to a rear surface of the backlight unit to be located in the second space; a through-hole formed in the middle frame; and a connection lead configured to electrically connect the panel drive unit to the electronic components loaded in the middle frame via the through-hole.

The display device may further comprise a pixel bracket disposed in one end edge of the coupling between the display panel and the backlight unit and fixed a predetermined region of the front surface of the display panel and a predetermined region of the rear surface of the backlight unit; and a pixel sensor fixed to the pixel bracket and overlapped with a predetermined front surface region of the display panel to partially sense an image of the display panel.

The display device pixel bracket may have a 'E' shape and the width of both ends is corresponding to the thickness of the coupling between the display panel and the backlight unit.

The display device according to at least one embodiment mentioned above has following effects.

The display device is capable of perform effective heat radiation by supplying cooled-air to the heat radiation space independently.

Furthermore, the heat exchanger may be provided in the rear case, not the middle frame in the display device. Accordingly, the sealing structure may become simple effectively.

Still further, the rear case of the display device may be open and closed by the front case. Accordingly, the usability of the display device may be enhanced effectively.

Still further, the rear case may be open and closed by using a relatively small force.

Still further, air flow may be prevented from being performed in an unintended region of the display device.

Still further, the location of the pixel sensor may be adjusted easily and the pixel sensor may be coupled to the adjusted proper location.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings, which are given by illustration only, and thus are not limitative of the present invention, and wherein.

DESCRIPTION OF SPECIFIC EMBODIMENTS

Figure 1:
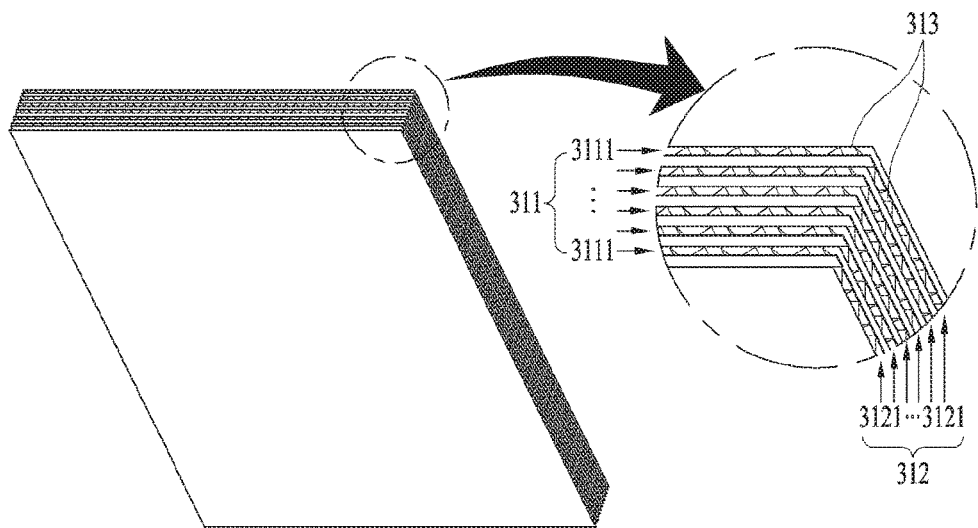
FIG. 1 is a diagram illustrating one embodiment of a heat exchanger in accordance with the present disclosure.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

A display device which is described hereinafter commonly means all type of devices including an output unit for outputting an image. Main examples of the display device include a digital TV, an analog TV, a desktop computer, a digital signage and the like.

Moreover, the examples of the display device may further include a middle-sized or large-sized output device such as a signage which is installed in an outdoor housing.

There is an outdoor billboard as one example of the output device.

As mentioned above, exemplary embodiments of the present disclosure are invented and developed with a focus on the display device such as the signage installed in such an outdoor housing.

A display device is a general name for devices configured to output images. An image output method may be categorized into a method which facilitates direct light emitting of a panel element by using an organic light-emitting diode and another method which uses a liquid crystal panel and a backlight unit for irradiating light to the liquid crystal panel.

The latter method is applied so as to describe embodiments of the present disclosure. Unique technical features of the present disclosure may be applicable to both methods.

Heat is generated during the driving of the display device so that the display device may require a heat radiation structure configured to dissipate such heat effectively. Heat is generated not only in the liquid crystal panel and the backlight unit but also in the substrate in which electronic components for driving image output are loaded. Accordingly, heat radiation needs to be required by each configuration which generates heat.

The heat radiation structure of the display device may be categorized into two types based on whether external air is directly led into the device.

One type of the heat radiation structure having external air directly led into the display device may be used in indoor devices such as TVs and monitors so as to be relatively free from waterproof or dustproof.

In this instance, external air is drawn into the device and the air provided with the heat radiated from the device is released outside the device to perform heat radiation.

While, a structure for protecting the display panel and inner electronic components has to be put into consideration for an outdoor display device.

Middle-sized and large-sized display devices which are usually used outdoors have a relatively high brightness to secure a sufficient outdoor visibility. The display devices are likely to be neglected under high outdoor temperatures. Accordingly, heat generation of the display device becomes a big issue.

The heat radiation or dissipation to solve such the heat generation problem is realized in the display device in diverse ways. Main examples of the heat radiation include an air-cooling system and a water-cooling system. Also, there is a further contact method which uses a heat pipe.

Such the heat radiation cooling systems may be used exclusively. As occasion demands, two or more systems may be used combinedly.

The air cooling system out of the systems for cooling such the middle-and-large sized display devices mentioned above may include a direct cooling system configured to filter dust or inflow foreign substances, using a filter, while direct inflow of external air is allowed and an indirect cooling system configured to generate heat exchange between external air and internal air of the device, using a heat exchanger, while external air and internal air are basically shut off from each other.

The indirect cooling system has an advantage of easy ongoing maintenance that internal air is not mixed with external air and a disadvantage of additional expenses for a sealing process.

Such a disadvantage is likely to give a supplier, who assembles and manufactures the entire display devices after provided with display modules, a trouble in re-processing the provided display modules and a difficult sealing structure because of its structural complexity.

Accordingly, it is necessary to consider a structure for manufacturing final display devices by simplifying the sealing structure and minimizing the deformation of the display modules.

FIG. 1 is a diagram illustrating one embodiment of a heat exchanger 310 in accordance with the present disclosure.

The heat exchanger 310 is used in the double cooling type display device 100 out of the closed types with respect to the outside mentioned above.

The heat exchanger 310 may basically include two units or parts. One unit or part is a closed heat exchange unit 311, sometimes referred to as a closed heat exchange part, provided as a passage of internal air and the other one is an open heat exchange unit 312, sometimes referred to as an open heat exchange part, provided as a passage of external air.

An inlet and an outlet of the closed heat exchange unit 311 are connected with an internal space of the display device 100 so that the high-temperature air with a relatively hotter heat may lead into the inlet of the heat exchanger 310. External air of the display device 100 lead into the inlet and out of the outlet of the display device 100, only not to be mixed with internal air of the display device. A specific structure related with such a technical feature will be described later.

The open heat exchange unit 312 exchanges heat with the closed heat exchange unit 311. The high-temperature air drawn into the inlet of the closed heat exchange unit 311 transmits heat to the relatively-low-temperature air of the open heat exchange unit 312.

The closed heat exchange unit 311 is configured to transmit heat to the open heat exchange unit 312 and the cooled air is re-exhausted from the outlet to be supplied to the display device 100, so that a heat radiation cycle may be complete.

For effective heat transmission, each of the open heat exchange unit 312 and the closed heat exchange unit 311 has to have a broad contact area and a material of a contact surface has to have high heat conductivity. To satisfy such conditions, the contact surface of the heat exchanger 310 may be formed of a metallic material having high heat conductivity.

The open heat exchange unit 312 and the closed heat exchange unit 311 have a plurality of holes 3111, 3121 to increase the contact surfaces, respectively. Each of the holes 3111, 3121 may be partitioned off by a partition wall. The partition wall has a relatively broad contact area.

The holes 3121 of the open heat exchange unit 312 may form one single layer shape and the holes 3111 of the closed heat exchange unit 311 may also form one single layer shape.

The layers of the open heat exchange unit 312 and the closed heat exchange unit 311 may be alternatively disposed.

The open heat exchange unit 312 and the closed heat exchange unit 311 may have passages, respectively, which are vertical to each other. When the open heat exchange unit 312 and the closed heat exchange unit 311 are vertically provided, the partition walls may be vertically provided to facilitate heat transmission in various directions and then effective heat transmission.

One condition for facilitate the heat transmission more effectively is rapid flow of air which passes the heat exchanger 310. For that, a fan 211 may be provided to form air flow so that the exchanged heat can flow without retaining.

A plurality of fans 211 may be provided in at least one of the inlet and outlet of the open heat exchange unit 312 and at least one of the inlet and outlet of the closed heat exchange unit 311 to increase air flow of each heat exchange unit.

That function may be performed by a closed cooling unit 210, sometimes referred to as a closed flow generator, and an open cooling unit 230, sometimes referred to as an open flow generator, which will be described in detail later.

Figure 2:
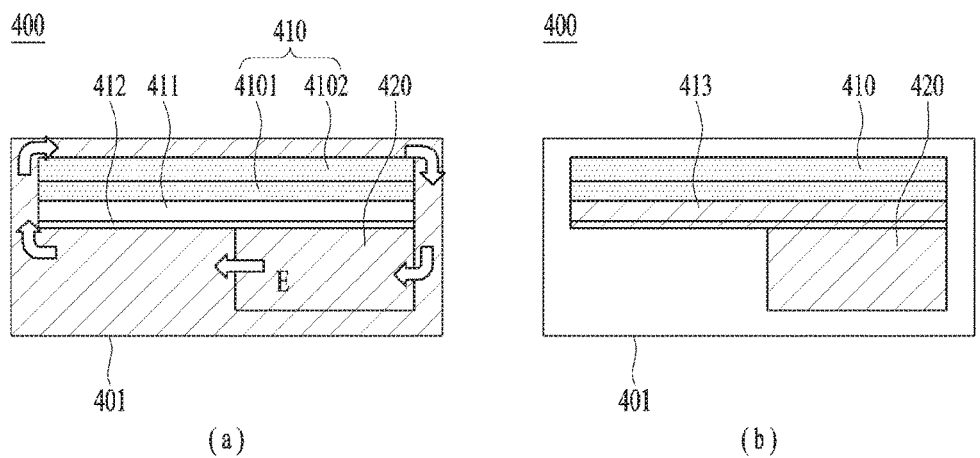
FIGS. 2 (a) and 2 (b) are schematic diagrams illustrating a heat radiation structure of a conventional display device.

FIGS. 2 (a) and 2 (b) are schematic diagrams illustrating a heat radiation structure of a conventional display device 400.

FIG. 2 (a) schematically illustrates a cross section area of a direction in which air is circulated in the conventional display device 400 and FIG. 2 (b) schematically illustrates one cross section area of a direction in which air is circulated outside the conventional display device 400.

The open heat exchange unit and the closed heat exchange unit mentioned above may be applied to the conventional display device 400.

In a housing 401 which defines an exterior of the display device 400 may be provide a display module 410 configured of a liquid crystal panel 4102 and a backlight unit 4101 which are coupled each other. A printed circuit board 412 is provided in a back side of the backlight unit 4101 while forming a preset gap 411. A heat exchanger 420 may be provided in a rear surface of the printed circuit board 412.

In other words, the heat exchanger 420 and the components are loaded in the housing 401.

The closed heat exchange unit of the heat exchanger 420 is configured to circulate the heat generated in the rear surface of the printed circuit board 412 and the heat generated in a front surface of the display module 410. The open heat exchange unit is configured to emit the heat transmitted from the closed heat exchange unit to the outside 413 of the display device.

The regions where heat is intensively generated may be the front surface of the liquid crystal panel, the rear surface of the backlight unit 4101 and the printed circuit board 412. However, air is circulated in the entire internal space of the conventional display device 400 and the air which failed to be cooled sufficiently might be re-drawn into the region which requires heat radiation.

Even though the heat exchanger 420 is provided in the display device 400, the open heat exchange unit has to exchange heat with the outside 413 and a sealing structure has to be realized in the display device for that.

Moreover, the heat exchanger 420 is loaded in the internal space of the display device 400 and has a large volume. Because of that, the space where the other structure and components are loaded is restricted and more heat might be intensively generated in the narrow space.

The liquid crystal panel 4102, the backlight unit 4101 and a liquid crystal drive unit for driving the liquid crystal panel 4102 may be provided in one display module 410, to configurate the display device 400. In this instance, the liquid crystal drive unit has to be separated and moved to the back side of the printed circuit board which is inside the display device 400 so as to prevent its opening from the outside 413. Accordingly, there might be additional expenses for the movement of the liquid crystal drive unit into the display device 400.

Figure 3:
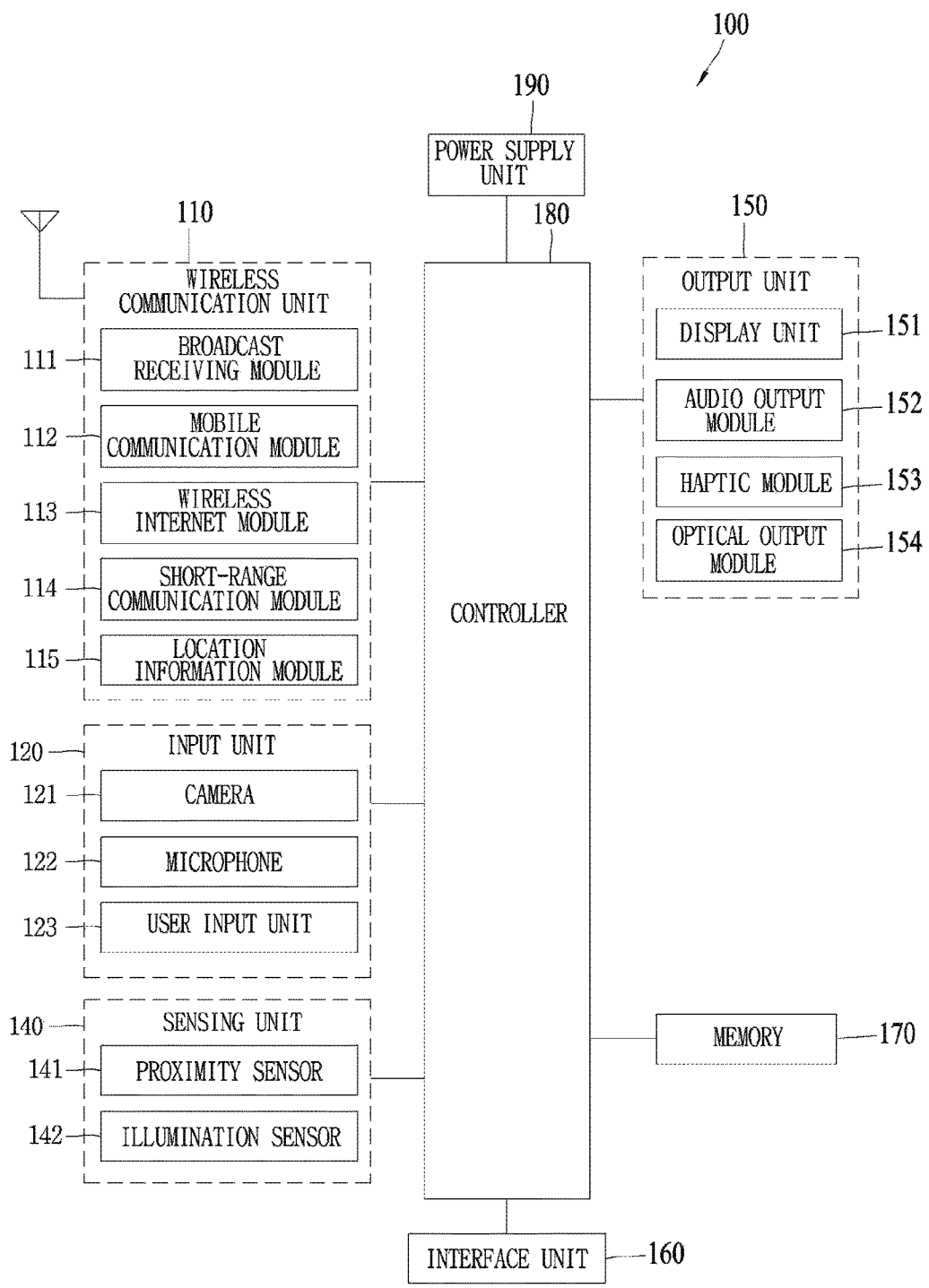
FIG. 3 is a block diagram to describe a display device in accordance with the present disclosure.

FIG. 3 is a block diagram to describe a display device 100 in accordance with the present disclosure.

The display device 100 is shown having components such as a wireless communication unit 110, an input unit 120, a sensing unit 140, an output unit 150, an interface unit 160, a memory 170, a controller 180, and a power supply unit 190. It is understood that implementing all of the illustrated components is not a requirement, and that greater or fewer components may alternatively be implemented.

The display device 100 is shown having wireless communication unit 110 configured with several commonly implemented components. For instance, the wireless communication unit 110 typically includes one or more components which permit wireless communication between the display device 100 and a wireless communication system or network within which the display device is located.

The wireless communication unit 110 typically includes one or more modules which permit communications such as wireless communications between the display device 100 and a wireless communication system, communications between the display device 100 and another display device, communications between the display device 100 and an external server. Further, the wireless communication unit 110 typically includes one or more modules which connect the display device 100 to one or more networks. To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the display device, the surrounding environment of the display device, user information, and the like. The sensing unit 140 is shown having a proximity sensor 141 and an illumination sensor 142.

If desired, the sensing unit 140 may alternatively or additionally include other types of sensors or devices, such as a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The display device 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154.

The display unit 151 may have an inter-layered structure or an integrated structure with a touch sensor in order to facilitate a touch screen. The touch screen may provide an output interface between the display device 100 and a user, as well as function as the user input unit 123 which provides an input interface between the display device 100 and the user.

The interface unit 160 serves as an interface with various types of external devices that can be coupled to the display device 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the display device 100 may perform assorted control functions associated with a connected external device, in response to the external device being connected to the interface unit 160.

The memory 170 is typically implemented to store data to support various functions or features of the display device 100. For instance, the memory 170 may be configured to store application programs executed in the display device 100, data or instructions for operations of the display device 100, and the like. Some of these application programs may be downloaded from an external server via wireless communication. Other application programs may be installed within the display device 100 at time of manufacturing or shipping, which is typically the case for basic functions of the display device 100 (for example, receiving a call, placing a call, receiving a message, sending a message, and the like). It is common for application programs to be stored in the memory 170, installed in the display device 100, and executed by the controller 180 to perform an operation (or function) for the display device 100.

The controller 180 typically functions to control overall operation of the display device 100, in addition to the operations associated with the application programs. The controller 180 may provide or process information or functions appropriate for a user by processing signals, data, information and the like, which are input or output by the various components depicted in FIG. 1A, or activating application programs stored in the memory 170. As one example, the controller 180 controls some or all of the components illustrated in FIG. 3 according to the execution of an application program that have been stored in the memory 170.

The power supply unit 190 can be configured to receive external power or provide internal power in order to supply appropriate power required for operating elements and components included in the display device 100. The power supply unit 190 may include a battery, and the battery may be configured to be embedded in the terminal body, or configured to be detachable from the terminal body.

Various components depicted in this figure will now be described in more detail. Regarding the wireless communication unit 110, the broadcast receiving module 111 is typically configured to receive a broadcast signal and/or broadcast associated information from an external broadcast managing entity via a broadcast channel. The broadcast channel may include a satellite channel, a terrestrial channel, or both. In some embodiments, two or more broadcast receiving modules 111 may be utilized to facilitate simultaneously receiving of two or more broadcast channels, or to support switching among broadcast channels.

The mobile communication module 112 can transmit and/or receive wireless signals to and from one or more network entities. Typical examples of a network entity include a base station, an external display device, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink Packet Access), Long Term Evolution (LTE), LTE-A (Long Term Evolution-Advanced), and the like). Examples of wireless signals transmitted and/or received via the mobile communication module 112 include audio call signals, video (telephony) call signals, or various formats of data to support communication of text and multimedia messages.

The wireless Internet module 113 is configured to facilitate wireless Internet access. This module may be internally or externally coupled to the display device 100. The wireless Internet module 113 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), HSUPA (High Speed Uplink Packet Access), Long Term Evolution (LTE), LTE-A (Long Term Evolution-Advanced), and the like. The wireless Internet module 113 may transmit/receive data according to one or more of such wireless Internet technologies, and other Internet technologies as well.

In some embodiments, when the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the display device 100 and a wireless communication system, communications between the display device 100 and another display device 100, or communications between the display device and a network where another display device 100 (or an external server) is located, via wireless area networks. One example of the wireless area networks is a wireless personal area networks.

In some embodiments, another display device (which may be configured similarly to display device 100) may be a wearable device, for example, a smart watch, a smart glass or a head mounted display (HMD), which is able to exchange data with the display device 100 (or otherwise cooperate with the display device 100). The short-range communication module 114 may sense or recognize the wearable device, and permit communication between the wearable device and the display device 100. In addition, when the sensed wearable device is a device which is authenticated to communicate with the display device 100, the controller 180, for example, may cause transmission of data processed in the display device 100 to the wearable device via the short-range communication module 114.

Hence, a user of the wearable device may use the data processed in the display device 100 on the wearable device. For example, when a call is received in the display device 100, the user may answer the call using the wearable device. Also, when a message is received in the display device 100, the user can check the received message using the wearable device.

The location information module 115 is generally configured to detect, calculate, derive or otherwise identify a position of the display device. As an example, the location information module 115 includes a Global Position System (GPS) module, a Wi-Fi module, or both. If desired, the location information module 115 may alternatively or additionally function with any of the other modules of the wireless communication unit 110 to obtain data related to the position of the display device.

As one example, when the display device uses a GPS module, a position of the display device may be acquired using a signal sent from a GPS satellite. As another example, when the display device uses the Wi-Fi module, a position of the display device can be acquired based on information related to a wireless access point (AP) which transmits or receives a wireless signal to or from the Wi-Fi module.

The input unit 120 may be configured to permit various types of input to the display device 120. Examples of such input include audio, image, video, data, and user input. Image and video input is often obtained using one or more cameras 121. Such cameras 121 may process image frames of still pictures or video obtained by image sensors in a video or image capture mode. The processed image frames can be displayed on the display unit 151 or stored in memory 170. In some cases, the cameras 121 may be arranged in a matrix configuration to permit a plurality of images having various angles or focal points to be input to the display device 100. As another example, the cameras 121 may be located in a stereoscopic arrangement to acquire left and right images for implementing a stereoscopic image.

The microphone 122 is generally implemented to permit audio input to the display device 100. The audio input can be processed in various manners according to a function being executed in the display device 100. If desired, the microphone 122 may include assorted noise removing algorithms to remove unwanted noise generated in the course of receiving the external audio.

The user input unit 123 is a component that permits input by a user. Such user input may enable the controller 180 to control operation of the display device 100. The user input unit 123 may include one or more of a mechanical input element (for example, a key, a button located on a front and/or rear surface or a side surface of the display device 100, a dome switch, a jog wheel, a jog switch, and the like), or a touch-sensitive input, among others. As one example, the touch-sensitive input may be a virtual key or a soft key, which is displayed on a touch screen through software processing, or a touch key which is located on the display device at a location that is other than the touch screen. On the other hand, the virtual key or the visual key may be displayed on the touch screen in various shapes, for example, graphic, text, icon, video, or a combination thereof.

The sensing unit 140 is generally configured to sense one or more of internal information of the display device, surrounding environment information of the display device, user information, or the like. The controller 180 generally cooperates with the sending unit 140 to control operation of the display device 100 or execute data processing, a function or an operation associated with an application program installed in the display device based on the sensing provided by the sensing unit 140. The sensing unit 140 may be implemented using any of a variety of sensors, some of which will now be described in more detail.

The proximity sensor 141 may include a sensor to sense presence or absence of an object approaching a surface, or an object located near a surface, by using an electromagnetic field, infrared rays, or the like without a mechanical contact. The proximity sensor 141 may be arranged at an inner region of the display device covered by the touch screen, or near the touch screen.

The proximity sensor 141, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like. When the touch screen is implemented as a capacitance type, the proximity sensor 141 can sense proximity of a pointer relative to the touch screen by changes of an electromagnetic field, which is responsive to an approach of an object with conductivity. In this case, the touch screen (touch sensor) may also be categorized as a proximity sensor.

The term "proximity touch" will often be referred to herein to denote the scenario in which a pointer is positioned to be proximate to the touch screen without contacting the touch screen. The term "contact touch" will often be referred to herein to denote the scenario in which a pointer makes physical contact with the touch screen. For the position corresponding to the proximity touch of the pointer relative to the touch screen, such position will correspond to a position where the pointer is perpendicular to the touch screen. The proximity sensor 141 may sense proximity touch, and proximity touch patterns (for example, distance, direction, speed, time, position, moving status, and the like).

In general, controller 180 processes data corresponding to proximity touches and proximity touch patterns sensed by the proximity sensor 141, and cause output of visual information on the touch screen. In addition, the controller 180 can control the display device 100 to execute different operations or process different data according to whether a touch with respect to a point on the touch screen is either a proximity touch or a contact touch.

A touch sensor can sense a touch applied to the touch screen, such as display unit 151, using any of a variety of touch methods. Examples of such touch methods include a resistive type, a capacitive type, an infrared type, and a magnetic field type, among others.

As one example, the touch sensor may be configured to convert changes of pressure applied to a specific part of the display unit 151, or convert capacitance occurring at a specific part of the display unit 151, into electric input signals. The touch sensor may also be configured to sense not only a touched position and a touched area, but also touch pressure and/or touch capacitance. A touch object is generally used to apply a touch input to the touch sensor. Examples of typical touch objects include a finger, a touch pen, a stylus pen, a pointer, or the like.

When a touch input is sensed by a touch sensor, corresponding signals may be transmitted to a touch controller. The touch controller may process the received signals, and then transmit corresponding data to the controller 180. Accordingly, the controller 180 may sense which region of the display unit 151 has been touched. Here, the touch controller may be a component separate from the controller 180, the controller 180, and combinations thereof.

In some embodiments, the controller 180 may execute the same or different controls according to a type of touch object that touches the touch screen or a touch key provided in addition to the touch screen. Whether to execute the same or different control according to the object which provides a touch input may be decided based on a current operating state of the display device 100 or a currently executed application program, for example.

The touch sensor and the proximity sensor may be implemented individually, or in combination, to sense various types of touches. Such touches includes a short (or tap) touch, a long touch, a multi-touch, a drag touch, a flick touch, a pinch-in touch, a pinch-out touch, a swipe touch, a hovering touch, and the like.

If desired, an ultrasonic sensor may be implemented to recognize position information relating to a touch object using ultrasonic waves. The controller 180, for example, may calculate a position of a wave generation source based on information sensed by an illumination sensor and a plurality of ultrasonic sensors. Since light is much faster than ultrasonic waves, the time for which the light reaches the optical sensor is much shorter than the time for which the ultrasonic wave reaches the ultrasonic sensor. The position of the wave generation source may be calculated using this fact. For instance, the position of the wave generation source may be calculated using the time difference from the time that the ultrasonic wave reaches the sensor based on the light as a reference signal.

The camera 121 typically includes at least one a camera sensor (CCD, CMOS etc.), a photo sensor (or image sensors), and a laser sensor.

Implementing the camera 121 with a laser sensor may allow detection of a touch of a physical object with respect to a 3D stereoscopic image. The photo sensor may be laminated on, or overlapped with, the display device. The photo sensor may be configured to scan movement of the physical object in proximity to the touch screen. In more detail, the photo sensor may include photo diodes and transistors at rows and columns to scan content received at the photo sensor using an electrical signal which changes according to the quantity of applied light. Namely, the photo sensor may calculate the coordinates of the physical object according to variation of light to thus obtain position information of the physical object.

The display unit 151 is generally configured to output information processed in the display device 100. For example, the display unit 151 may display execution screen information of an application program executing at the display device 100 or user interface (UI) and graphic user interface (GUI) information in response to the execution screen information.

In some embodiments, the display unit 151 may be implemented as a stereoscopic display unit for displaying stereoscopic images. A typical stereoscopic display unit may employ a stereoscopic display scheme such as a stereoscopic scheme (a glass scheme), an auto-stereoscopic scheme (glassless scheme), a projection scheme (holographic scheme), or the like.

The audio output module 152 is generally configured to output audio data. Such audio data may be obtained from any of a number of different sources, such that the audio data may be received from the wireless communication unit 110 or may have been stored in the memory 170. The audio data may be output during modes such as a signal reception mode, a call mode, a record mode, a voice recognition mode, a broadcast reception mode, and the like. The audio output module 152 can provide audible output related to a particular function (e.g., a call signal reception sound, a message reception sound, etc.) performed by the display device 100. The audio output module 152 may also be implemented as a receiver, a speaker, a buzzer, or the like.

A haptic module 153 can be configured to generate various tactile effects that a user feels, perceive, or otherwise experience. A typical example of a tactile effect generated by the haptic module 153 is vibration. The strength, pattern and the like of the vibration generated by the haptic module 153 can be controlled by user selection or setting by the controller. For example, the haptic module 153 may output different vibrations in a combining manner or a sequential manner.

Besides vibration, the haptic module 153 can generate various other tactile effects, including an effect by stimulation such as a pin arrangement vertically moving to contact skin, a spray force or suction force of air through a jet orifice or a suction opening, a touch to the skin, a contact of an electrode, electrostatic force, an effect by reproducing the sense of cold and warmth using an element that can absorb or generate heat, and the like.

The haptic module 153 can also be implemented to allow the user to feel a tactile effect through a muscle sensation such as the user's fingers or arm, as well as transferring the tactile effect through direct contact. Two or more haptic modules 153 may be provided according to the particular configuration of the display device 100.

An optical output module 154 can output a signal for indicating an event generation using light of a light source. Examples of events generated in the display device 100 may include message reception, call signal reception, a missed call, an alarm, a schedule notice, an email reception, information reception through an application, and the like.

A signal output by the optical output module 154 may be implemented in such a manner that the display device emits monochromatic light or light with a plurality of colors. The signal output may be terminated as the display device senses that a user has checked the generated event, for example.

The interface unit 160 serves as an interface for external devices to be connected with the display device 100. For example, the interface unit 160 can receive data transmitted from an external device, receive power to transfer to elements and components within the display device 100, or transmit internal data of the display device 100 to such external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating authority of using the display device 100 and may include a user identity module (UIM), a subscriber identity module (SIM), a universal subscriber identity module (USIM), and the like. In addition, the device having the identification module (also referred to herein as an "identifying device") may take the form of a smart card. Accordingly, the identifying device can be connected with the terminal 100 via the interface unit 160.

When the display device 100 is connected with an external cradle, the interface unit 160 can serve as a passage to allow power from the cradle to be supplied to the display device 100 or may serve as a passage to allow various command signals input by the user from the cradle to be transferred to the display device there through. Various command signals or power input from the cradle may operate as signals for recognizing that the display device is properly mounted on the cradle.

The memory 170 can store programs to support operations of the controller 180 and store input/output data (for example, phonebook, messages, still images, videos, etc.). The memory 170 may store data related to various patterns of vibrations and audio which are output in response to touch inputs on the touch screen.

The memory 170 may include one or more types of storage mediums including a Flash memory, a hard disk, a solid state disk, a silicon disk, a multimedia card micro type, a card-type memory (e.g., SD or DX memory, etc), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, an optical disk, and the like. The display device 100 may also be operated in relation to a network storage device that performs the storage function of the memory 170 over a network, such as the Internet.

The controller 180 may typically control the general operations of the display device 100. For example, the controller 180 may set or release a lock state for restricting a user from inputting a control command with respect to applications when a status of the display device meets a preset condition.

The controller 180 can also perform the controlling and processing associated with voice calls, data communications, video calls, and the like, or perform pattern recognition processing to recognize a handwriting input or a picture drawing input performed on the touch screen as characters or images, respectively. In addition, the controller 180 can control one or a combination of those components in order to implement various exemplary embodiments disclosed herein.

The power supply unit 190 receives external power or provide internal power and supply the appropriate power required for operating respective elements and components included in the display device 100. The power supply unit 190 may include a battery, which is typically rechargeable or be detachably coupled to the terminal body for charging.

The power supply unit 190 may include a connection port. The connection port may be configured as one example of the interface unit 160 to which an external charger for supplying power to recharge the battery is electrically connected.

As another example, the power supply unit 190 may be configured to recharge the battery in a wireless manner without use of the connection port. In this example, the power supply unit 190 can receive power, transferred from an external wireless power transmitter, using at least one of an inductive coupling method which is based on magnetic induction or a magnetic resonance coupling method which is based on electromagnetic resonance.

Figure 4:
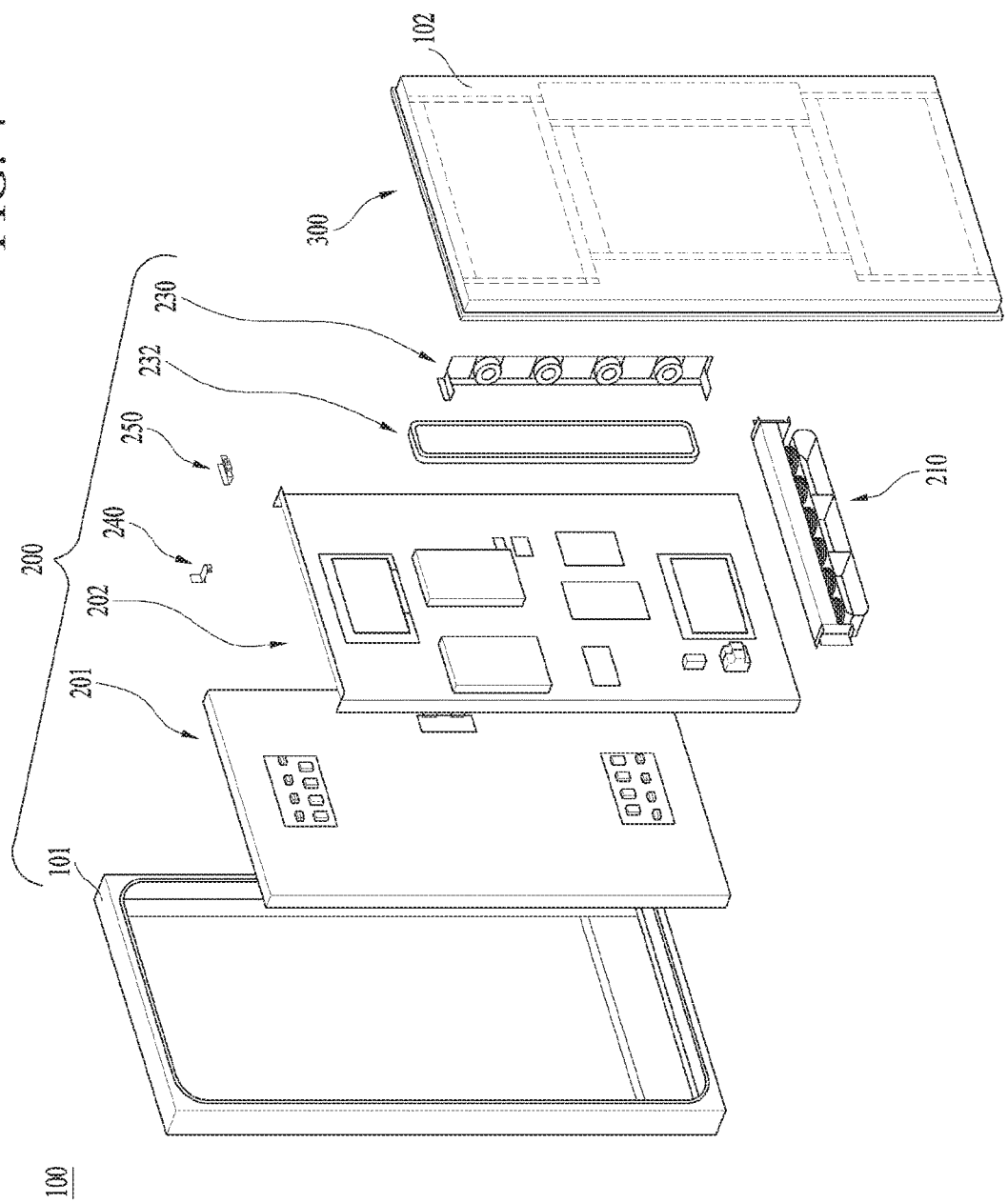
FIG. 4 is an exploded perspective diagram of the display device.

FIG. 4 is an exploded perspective diagram of the display device 100 in accordance with the present disclosure.

The exterior of the display device 100 may be defined by a front case 101 and a rear case 102. The front case 101 and the rear case 102 are coupled to each other and then an electric control portion for loading the components of the display device 100 therein may be formed in an internal space formed between the front case 101 and the rear case 102.

The front case 101 may define an exterior of a front surface and a partial exterior of a lateral surface. The display panel 2011 (See FIG. 6) and the backlight unit 2012 (See FIG. 6) are provided in the electric control portion of the front case 101.

As mentioned above, the display panel 2011 may mean a liquid crystal panel.

The backlight unit 2012 may be coupled to a back side of the display panel 2011 and configured to provide light to the back side of the display panel 2011. Especially, the backlight unit 2012 may be provided as a direct type backlight unit.

The middle frame 202 may be provided in a back side of the display module 201. The middle frame 202 may include a heat insulative printed circuit board where electronic components for display device 400 are loaded.

The rear case 102 is provided in a back side of the front case 101 and covers the middle frame 202. If necessary, the rear case 102 may be selectively open and closed with respect to the front case 101 and the detailed description will be made later.

Figure 5:
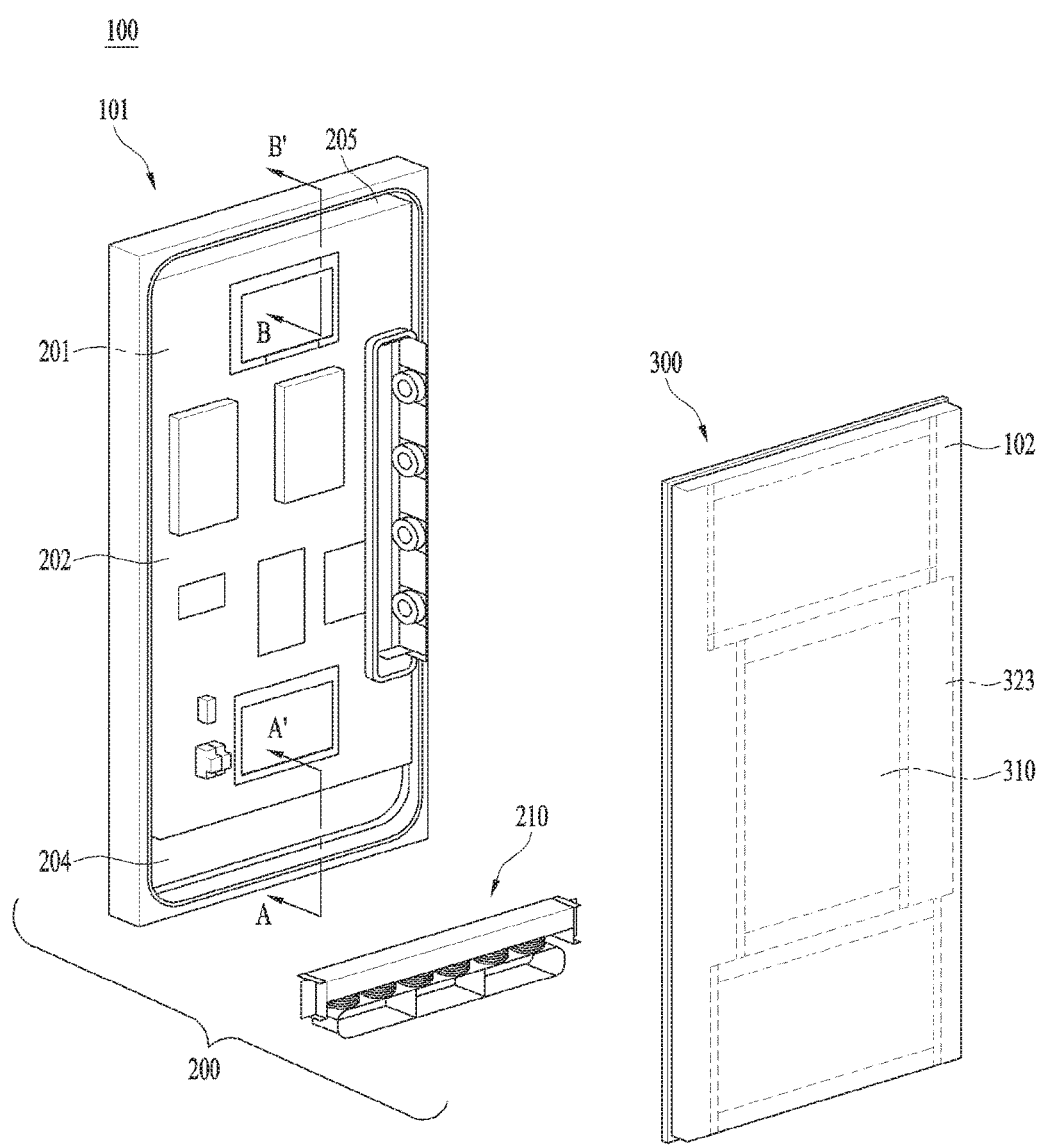
FIG. 5 is a partial exploded perspective of the display device.

FIG. 5 is a partial exploded perspective of the display device 100.

Figure 6:
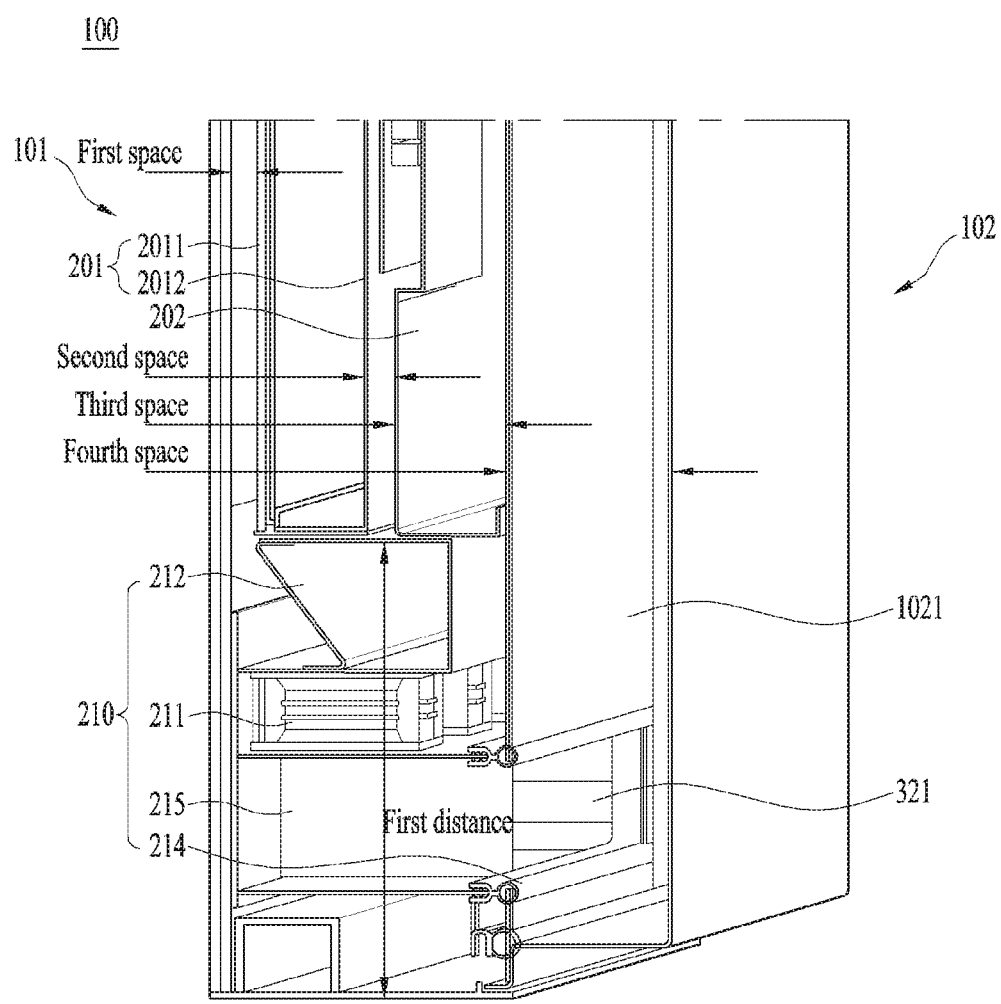
FIG. 6 is a sectional diagram of a coupling state shown in FIG. 5 along A-A'.
Figure 7:
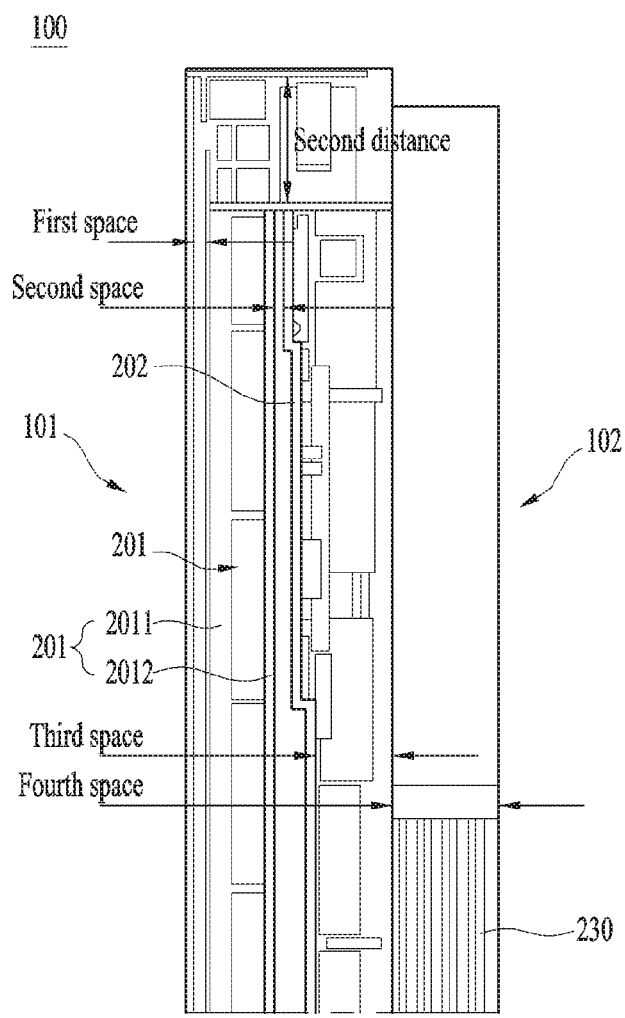
FIG. 7 is a sectional diagram of FIG. 5 along B-B'.

FIG. 6 is a sectional diagram of a coupling state shown in FIG. 5 along A-A' and FIG. 7 is a sectional diagram of FIG. 5 along B-B'.

FIGS. 5 through 7 illustrate air flow of the display device 100. For convenience of explanation, FIGS. 5 to 7 are referred to simultaneously.

The display panel 2011 may be distant from the inside of the front surface of the front case 101 enough to define a first space.

The middle frame 202 may be distant from a back side of the backlight unit 2012 enough to define a second space.

A lower end of the display module 201 may be spaced a first distance apart from a lower end of the front case 101 so that the front case 101 may secure a space for seating the first fan 211 to provide a closed cooling unit 210.

Similarly, an upper end of the display module 201 may be spaced a second distance apart from the lower end of the front case 101 to form a space. The space formed by the second distance may form an upper passage 205 out of air flow passages which will be described later.

The rear case 102 is coupled to the front case 101 to close the internal space of the display device 100 airtight with respect to the outside.

When the rear case 102 is coupled to the front case 101, a front plate 1021 of the rear case 102 may be spaced a preset distant apart from a rear surface of the middle frame 202 provided in the front case 101. The space formed between the middle frame 202 and the rear case 102 may be defined as a third space.

The third space may partially form a passage along which air for radiating heat of the electronic components provided in the middle frame 202 flows.

Most of the heat generated in the display panel 2011 may be radiated by the air passing through the first space and the heat generated in the backlight unit 2012 may be radiated by the air passing through the second space. The heat generated in the electronic components 203 of the middle frame 202 may be radiated by the air passing through the third space.

The closed cooling unit 210 may be configured to directly generate internal air circulation for heat radiation.

The closed cooling unit 210 may be disposed such that air is permitted to flow between the closed cooling unit 210 and the first, second or third spaces. The predetermined regions of the first, second and third spaces may include a lower end of the coupled portion between the display panel 2011 and the backlight unit 2012, in other words, a first fan seating portion 204.

The present embodiment is described on the assumption that the closed cooling unit 210 is provided in the lower end of the display device 100. As occasion occurs, the closed cooling unit 210 may be provided in the upper end of the display device 100.

The closed cooling unit 210 may be configured to make air sucked into the first, second and third spaces by generating a pressure difference between front and rear surfaces of the fan 211 through the rotation of the fan 211 provided therein.

At this time, the air before being sucked into the closed cooling unit 210 is cooled after passing through the heat exchanger 310 mentioned above. Different from the related art to which the present disclosure pertains, the air sucked into the first through third spaces is the air having passed through the closed cooling unit 210. Accordingly, the air heated in the other regions will not return to gain a higher heat radiation effect.

The air drawn into the first, second and third spaces may be provided with the heat generated in each region of the display device 100 and heated, only to flow to an upper passage 205.

Figure 8:
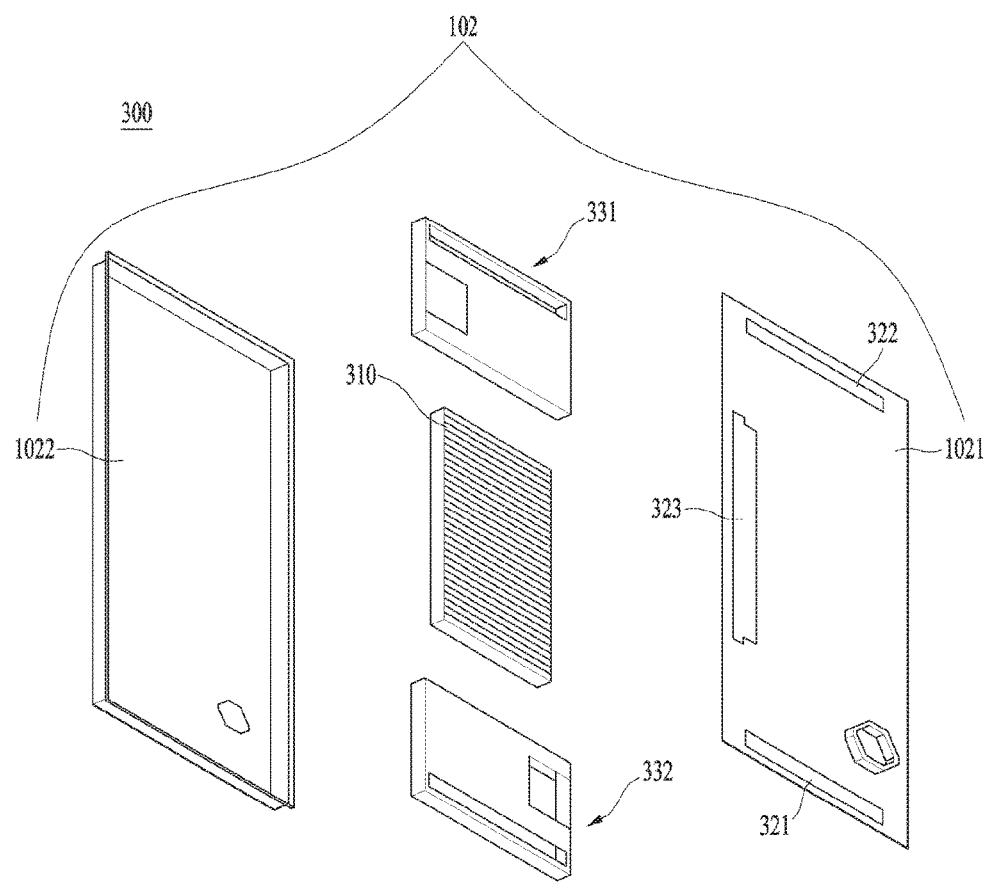
FIG. 8 is an exploded perspective diagram of a rear portion in accordance with the present disclosure.
Figure 9:
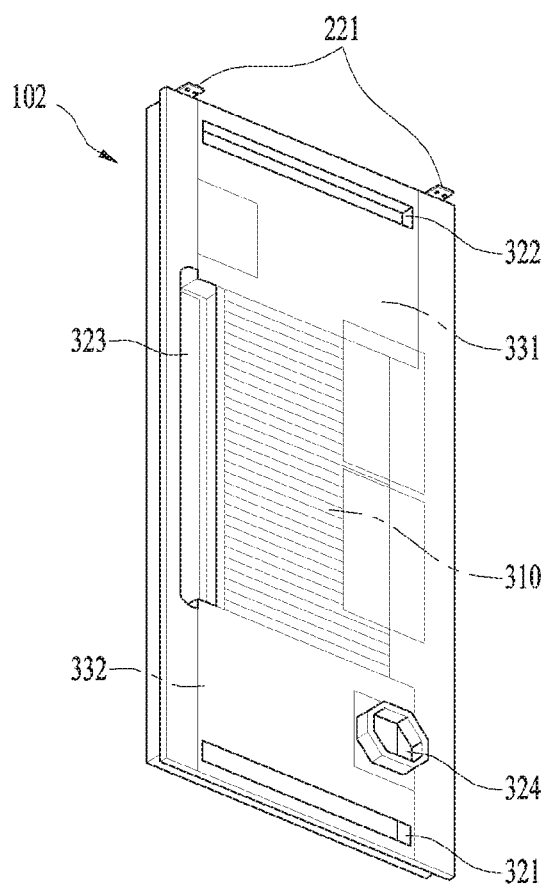
FIG. 9 is a perspective diagram illustrating a coupling state of the rear portion.

FIG. 8 is an exploded perspective diagram of a rear portion 300 in accordance with the present disclosure. FIG. 9 is a perspective diagram illustrating a coupling state of the rear portion 300.

FIGS. 8 and 9 illustrate air flow in the rear surface 300 of the display device 100.

The rear portion 300 means a concept including the rear case 102 and the electronic components loaded in the rear case 102.

As mentioned above, the rear case 102 is coupled to the rear surface of the front case 101. So the first space, the second space, and the third space are enclosed such that air is not permitted to flow between the first, second and third spaces and an exterior of the display devices.

An inner space is formed in the rear case 102 by the front plate 1021 and the rear plate 1022 spaced apart from each other. The heat exchanger 310 may be provided near a center of the inner space formed by the rear case 102. An upper bracket 331 and a lower bracket 332 may be provided in upper and lower portions of the heat exchanger 310 to form air flow.

The upper bracket 331 and the lower bracket 332 are configured to form a border for preventing the air exhausted from the front portion 200 and the air drawn into the front portion 200 from flowing to an unintended region.

In the rear case 102, the space located beneath the heat exchanger 310 may be defined as a fourth space. The space located upper the heat exchanger 310 may be defined as a fifth space. More specifically, the space formed by the lower bracket 332 may be the fourth space and the space formed by the upper bracket 331 may be the fifth space.

The air cooled by the heat exchanger 310, especially, the closed heat exchange unit 311 is drawn from the fourth space into the closed cooling unit 210.

The air flow drawn into the first space, the second space and the third space after passing through the closed cooling unit 210 is shown in FIGS. 5 through 7.

The air heated while passing through the first through third spaces may flow through the upper passage 205 of the front portion 200 (See FIG. 5) and flow into the rear portion 300 via the upper duct hole 322.

The air having passed through the upper duct hole 322 flows through the fifth space and then into the heat exchanger 310, especially, the closed heat exchange unit 311.

The air flowing through the closed heat exchange unit 311 exchange heat with the air flowing through the open heat exchange unit 312 (See FIG. 1) to be cooled and re-supplied to the fourth space.

More specifically, the closed heat exchange unit 311 may be disposed at the rear case 102 and configured such that air is permitted to flow between the closed heat exchange unit 311 and the first, second and third space via the closed cooling unit 210.

The open heat exchange unit 312 may be disposed at the rear case 102 and configured such that air is permitted to flow between the open heat exchange unit 312 and the exterior of the display device 100.

As such the air flow is repeated and maintained, the heat generated in the display device 100 may be released outside.

Referring to FIG. 6 again, the first space has more generated-heat even though formed with a narrower width in a back and forth direction than the second space. So the first space requires sufficient air inflow.

To satisfy the requirement, the closed cooling unit 210 may include a guide chamber 212. The guide chamber 212 may be formed from the front surface of the fan 211 to a lower boundary of the display panel 2011 and the backlight unit 2012 to distinguish the first space and the second space from each other.

The guide chamber 212 is configured to prevent the air from converging in the second space more than the first space. In other words, the guide chamber 212 may be configured to adjust the flow amount of the air drawn into the first space and the second space.

Accordingly, a start point of the guide chamber 211 at the fan 211 may be located behind an end point at the display panel 2011. An opening of the guide chamber 211 proximate to the closed cooling unit 210 is wider than an opening of the guide chamber 211 proximate to the first space.

More specifically, the guide chamber 212 has an angled guide surface to make the width of the passage get narrower along a direction toward the first space from the closed cooling unit 210.

Figure 10:
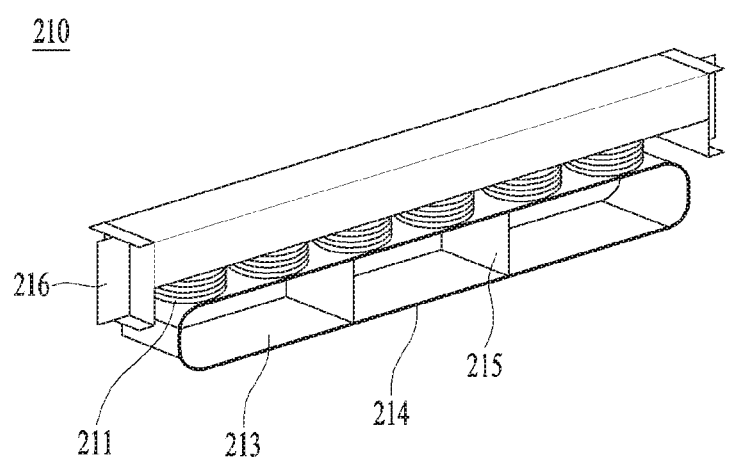
FIG. 10 is a perspective diagram of a closed cooling unit in accordance with the present disclosure.

FIG. 10 is a perspective diagram of the closed cooling unit 210 in accordance with the present disclosure.

The closed cooling unit 210 may be longitudinally provided along one direction with respect to a corner of the coupling portion between the display panel 2011 and the backlight unit 2012.

The closed cooling unit 210 may include fixing brackets 216 provided in both sides thereof to be coupled to the front case 101. The fixing brackets 216 and the front case 101 are fastened to each other by using a screw.

The plurality of the fans 211 may be provided along a longitudinal direction of the closed cooling unit 210 and configured to prevent the display device 100 from becoming too thick and enhance the heat radiation efficiency by blowing air to the first, second and third spaces uniformly.

The drawing shows that six fans 211 are provided as one example and more or less fans may be provided.

A fan bracket 213 may be provided in the front case 101 and configured to guide the passage of the rear surface of the closed cooling unit 210 and fix the fans 211.

The strength of the fan bracket 213 may be supplemented by a support partition wall 215. The support partition wall 215 stands in a width direction of the fan bracket 213 to minimize the deformation of the fan bracket 213 which might be caused by the load of the other components.

A fan bracket gasket 214 is disposed between the fan bracket 213 and the rear case 102 at a lower duct hole 321. The fan bracket gasket 214 may be formed along a circumference of the fan bracket 213 and configured to allow the air drawn via the lower duct hole 321 to keep a sufficient pressure difference.

The fan bracket gasket 214 may include rubber having elasticity which is pressable.

Figure 11:
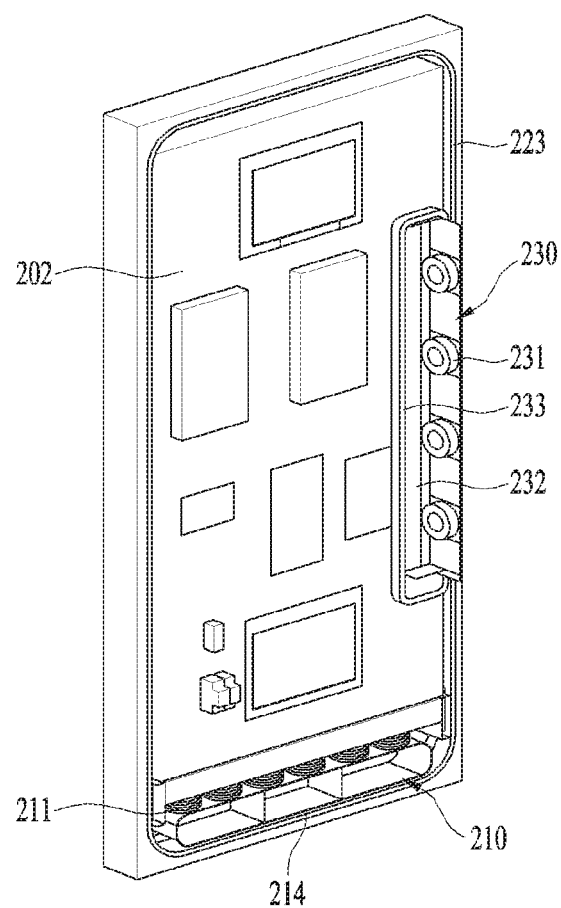
FIG. 11 is a diagram illustrating a back side of a front portion provided in the display device.

FIG. 11 is a diagram illustrating a back side of the front portion 200 provided in the display device 100.

Additional gaskets as well as the fan bracket gasket 214 have to be provided to prevent the air from leaking to unintended spaces.

A gasket 223 is disposed between the front case 101 and the rear case 102 and configured to closely contact with an inner surface of the closed rear case 102. The closed display device 100 may prevent external air from being drawn by the gasket 223.

The open cooling unit 230 may be provided in a predetermined region of the open heat exchange unit 312 (See FIG. 1) and configured to flow air from the inside the open heat exchange unit 312 to outside smoothly. That function may be realized by la fan 231 of the open cooling unit 230.

The open heat exchange unit 312 forms a passage with respect to the outside and air inside the open heat exchange unit 312 is provided with heat from the closed heat exchange unit 311, so that the open cooling unit 230 may form air flow in the open heat exchange unit 312 to exhaust the heated air outside.

The open cooling unit 230 may be provided in a predetermined region of the rear surface of the middle frame 202 to be located in the open heat exchange unit 312 when the rear case 102 is closed.

The rear case 102 may include a second fan seating portion 323 formed corresponding to the shape of the open cooling unit 230 to locate the open cooling unit 230 in a predetermined region of the open heat exchange unit 312 when the front case 101 is closed (see FIG. 8 or 9).

The open cooling unit 230 may be exposed outside while coupled to the middle frame 202, so that it needs to be spaced apart from the third space.

A third gasket 233 is configured to partition off the open cooling unit 230 from the third space. The third gasket 233 may be provided along a circumference of the fan seating bracket 232 coupled to the open cooling unit 230.

The gasket 223 and the third gasket 233 may be formed of a compressible rubber material having elasticity.

Figure 12:
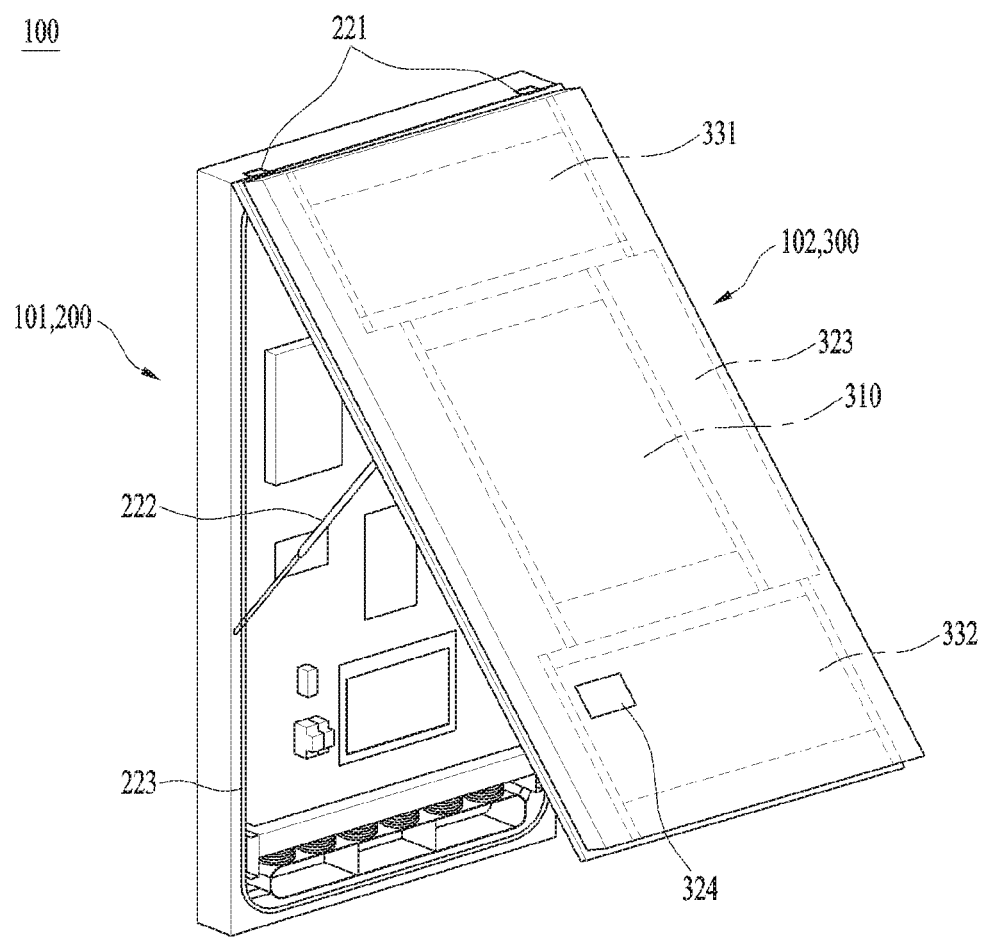
FIG. 12 is a diagram illustrating one embodiment of the display device in a state where a rear case is open.

FIG. 12 is a diagram illustrating one embodiment of the display device 100 in a state where the rear case 102 is open.

The rear case 102 may have a structure configured to selectively open and close the front case 101. When the rear case 102 is open, the middle frame 202 is exposed outside.

A hinge unit 221 may be fastened from one side of the front case 101 and the rear case 102. The hinge unit 211 hingedly couple the front case 101 and the rear case 102. The present embodiment shows that the hinge unit 221 is provided in an upper end of the display device 100.

The rear case 102 may selectively open and close the front case 101 by using the hinge unit 221. When the front case 101 is open, the electronic components of the middle frame 202 are exposed to perform work efficiently.

In this instance, the first, second and third spaces are exposed outside so that the rear case 102 has to be closed in use.

A gas spring unit 222 has one side coupled to an inner front surface of the rear case 102 and the other side coupled to the middle frame 202 so as to provide a pressurized force generated by gas when the rear case 102 is opened from the front case 101. The gas spring allows the user to open and close the rear case 102 with a relatively weak force.

Rather than the method using the whole rear case 102 in opening/closing the front case 101, an auxiliary opening/closing member 324 may be formed in the rear case 102 to open and close only a predetermined portion of the rear case 102 before a needed work has to be performed.

The auxiliary opening/closing member 324 may be provided in the lower duct hole 321 and the upper duct hole 322. Once a back cover of the rear case 102 and the auxiliary opening/closing member 324 are open, at least one electronic component loaded in the middle frame 202 may be exposed outside.

The auxiliary opening/closing member 324 is sealed with the rear case 102 to block the third space and the internal space of the rear case 102. The back cover is configured to block the internal space of the rear case 102 from the outside so as to prevent the unintended air inlet into the rear case 102.

Figure 13:
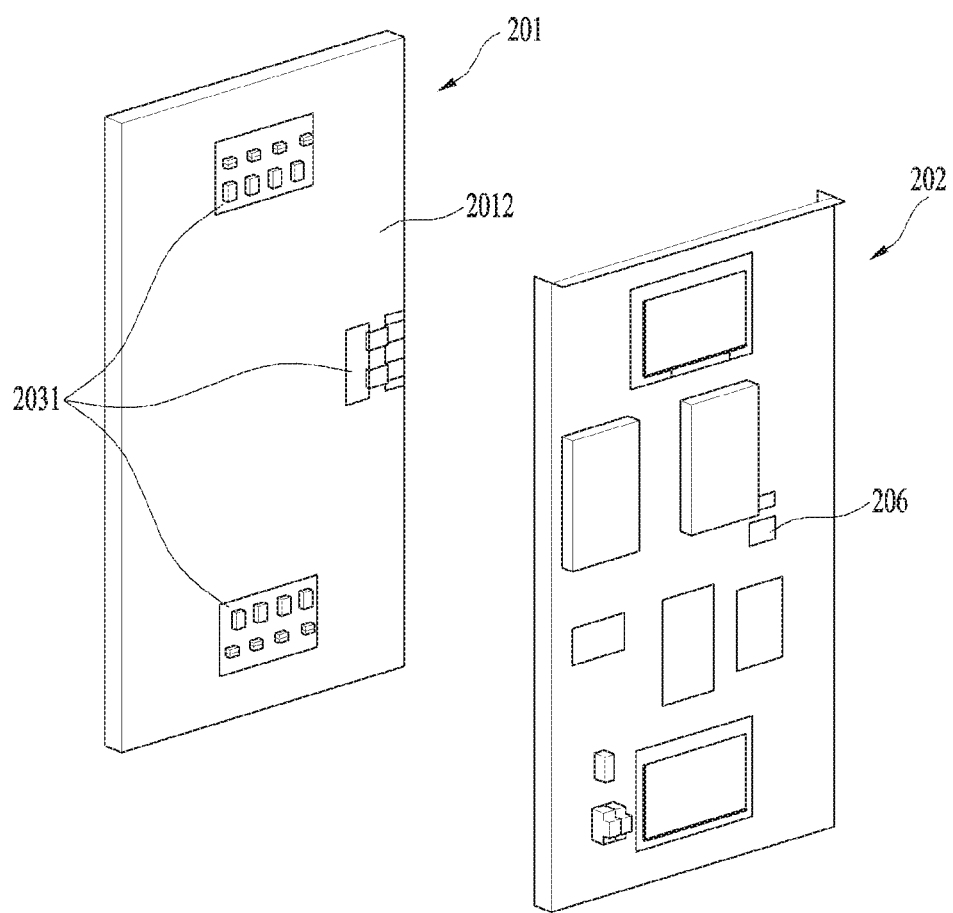
FIG. 13 is a perspective diagram illustrating the back side in a state where a display module and a middle frame are decoupled from each other in the display device.

FIG. 13 is a perspective diagram illustrating the back side in a state where the display module 201 and the middle frame 202 are decoupled from each other in the display device 100.

The panel drive unit 2031 means the electronic components 203 configured to directly drive the display panel 2011 and the backlight unit 2012. The panel drive unit 2031 may be coupled to a rear surface of the backlight unit 2012.

Especially, those three components may be supplied as one display module 201. Accordingly, to save the expenses, it is preferred that the panel drive unit 2031 is coupled to the backlight unit 2012 as it is.

The panel drive unit 2031 is coupled to the front surface of the middle frame 202 and implemented to perform electrical interaction with the electronic components 203 loaded in the rear surface of the middle frame 202.

The second space formed between the display module 201 and the middle frame 202 is blocked from the outside. Accordingly, even when the panel drive unit 2031 is provided in the second space as it is, no additional sealing is required.

That structure results in an effect of cost saving, compared with the conventional structure which requires the additional sealing as the second space is open.

The panel drive unit 2031 may be connected with the electronic components 203 loaded in the rear surface of the middle frame 202 via a through-hole 206 formed in the middle frame 202. When the through-hole 206 is formed, a connection lead may electrically connect the panel drive unit 2031 with the electronic components 203 via the through hole.

In this instance, additional sealing may be provided to prevent the second and third spaces from being indistinguishable from each other by the through-hole 206 and the connection lead.

Figure 14:
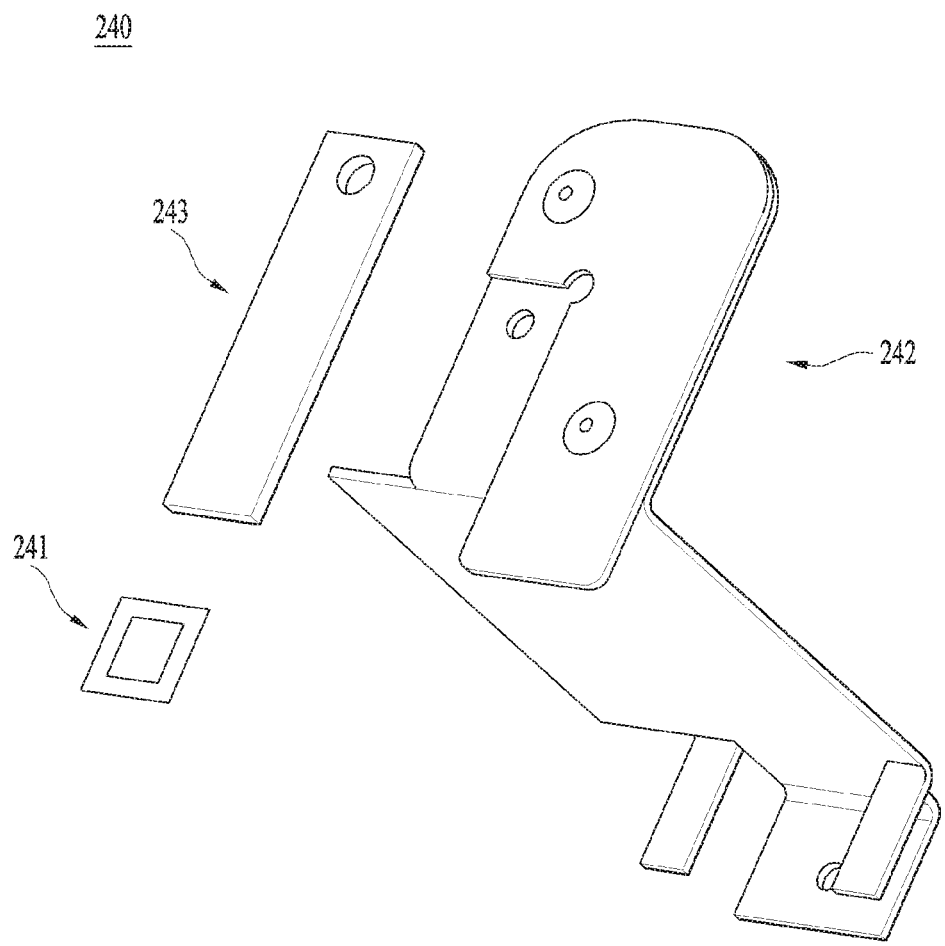
FIG. 14 is a diagram illustrating one embodiment of a pixel sensing module provided in the display device.

FIG. 14 is a diagram illustrating one embodiment of a pixel sensing module 240 provided in the display device 100.

The pixel sensing module 240 is provided in the display device 100 and configured to sense whether the display panel 2011 outputs an image properly or what image the display panel 2011 outputs. A pixel sensor 241 which functions as an actual sensor may be fixed to a pixel bracket 242 and then to the display device 100.

The pixel sensor 241 is overlapped with a predetermined region of the front surface of the display panel 2011 and configured to optically sense the region.

The pixel bracket 242 may be seated on one corner of the display module 210 configured of the display panel 2011 and the backlight unit 2012.

The pixel bracket 242 has a 'E' shape to fixedly hold some region of the front surface of the display panel 2011 and some region of the rear surface of the backlight unit like pincers.

For that, the width between both ends of the pixel bracket 242 like pincers may be corresponding to the coupling thickness between the display panel 2011 and the backlight unit 2012.

Considering that the pixel sensor 241 has to be provided in some region of the front surface of the display module 201, the conventional pixel sensor 241 is provided between the display module 201 and the front case 101 and it is then difficult to secure the pixel sensor 241 to an exact location. To move the pixel sensor 241 to a proper location if necessary, the coupling between the display module 201 and the front case 101 has to be released.

The pixel sensing module 240 including the pixel bracket 242 may locate the display module 201 and the front case 101 in desired positions by sliding them along one corner of the display module 201, without separating them.

The pixel bracket 242 and the pixel sensor 241 may be indirectly coupled to each other by a pixel gasket 243. The pixel gasket 243 may suppress the pixel bracket 242 with high stiffness not to damage a front output region of the display panel 2011 by direct contact.

Figure 15:
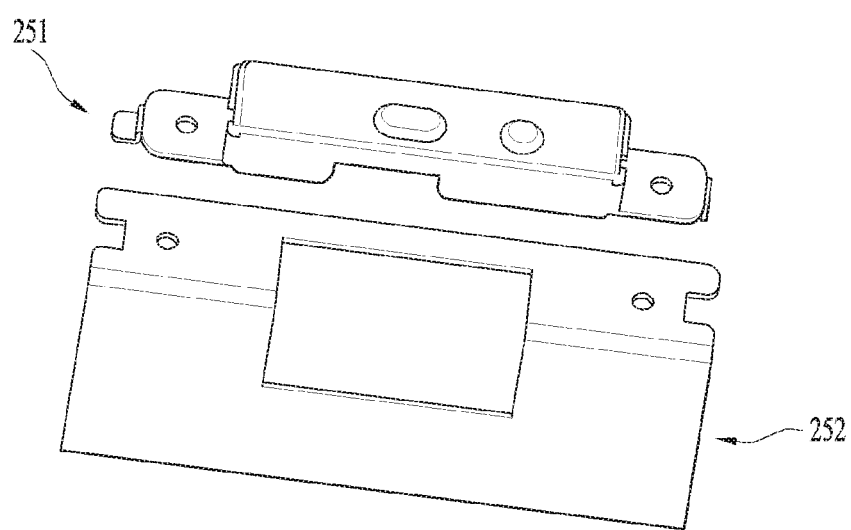
FIG. 15 is a diagram illustrating one embodiment of an infrared reception module provided in the display device.

FIG. 15 is a diagram illustrating one embodiment of an infrared reception module 250 provided in the display device 100.

The infrared reception module 250 is configured to receive and transmit an infrared signal to the display device 100.

An infrared sensor provided in the infrared reception module 250 is coupled to an infrared bracket to be directed toward the front surface of the display device 100. Especially, the infrared sensor may be provided in the front surface of the front case 101.

The infrared bracket has the ' E' shape like the pixel sensing module 240 shown in FIG. 14 and it is insertedly fitted to the display module 201 to be sliding or secured. Repeated description is omitted accordingly.

Various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds, are therefore intended to be embraced by the appended claims.

What is claimed is:

1. A display device comprising: a front case; a display panel spaced apart from the front case to define a first space therebetween; a backlight unit coupled to a rear surface of the display panel; a middle frame spaced apart from a rear surface of the backlight unit to define a second space therebetween; a rear case spaced apart from a rear surface of the middle frame to define a third space therebetween, wherein the rear case is coupled to the front case to enclose the first space, the second space, and the third space such that the enclosed first, second, and third spaces are airtight from an exterior of the display device; a closed flow generator disposed such that air is permitted to flow between the closed flow generator and the first, second, and third spaces; an open flow generator; and a heat exchanger comprising; a closed heat exchange part disposed at the rear case and configured such that air is permitted to flow between the closed heat exchange part and the first, second, and third spaces via the closed flow generator; and an open heat exchange part disposed at the rear case and configured such that air is permitted to flow between the open heat exchange part and the exterior of the display device, wherein the open heat exchange part is further configured to exchange heat with the closed heat exchange part, wherein the open flow generator is configured to exhaust air from the open heat exchange part to the exterior of the display device.

2. The display device of claim 1, further comprising:
a guide chamber configured to guide air from the closed flow generator into the first space and the second space.

3. The display device of claim 2, wherein the guide chamber comprises an angled guide surface such that an opening of the guide chamber proximate to the closed flow generator is wider than an opening of the guide chamber proximate to the first space.

4. The display device of claim 1, further comprising:
a hinge unit configured to hingedly couple the front case and the rear case; and
a gas spring unit configured to provide a pressurized force when the rear case is opened from the front case.

5. The display device of claim 1, wherein the closed flow generator comprises:
one or more fans; and
a fan bracket configured to form an air passage between the one or more fans and a rear of the closed flow generator,
wherein the fan bracket comprises at least one support wall partitioning the air passage.

6. The display device of claim 1, wherein:
the closed flow generator comprises a fan bracket configured to form an air passage between one or more fans of the closed flow generator and a rear of the closed flow generator;
the rear case comprises a lower duct hole corresponding to the rear of the closed flow generator and configured to permit air to flow between the closed heat exchange part and the fan bracket; and
a fan bracket gasket is disposed between the fan bracket and the rear case at the lower duct hole.

7. The display device of claim 1, further comprising a gasket disposed between the front case and the rear case.

8. The display device of claim 1, further comprising:
a panel drive unit coupled to a rear surface of the backlight unit and disposed in the second space; and
a connection lead configured to electrically couple the panel drive unit to one or more electronic components coupled to a rear surface of the middle frame via a through-hole at the middle frame.

9. The display device of claim 1, further comprising:
a pixel bracket disposed at an edge of the display panel and coupled to the display panel and the backlight unit; and
a pixel sensor coupled to the pixel bracket and disposed to be overlapped with a front portion of the display panel to sense information displayed at the front portion of the display panel.

10. The display device of claim 9, wherein the pixel bracket has a C shape having an opening configured to accommodate a combined thickness of the display panel and the backlight unit.

11. The display device of claim 1, wherein:
the closed flow generator comprises a plurality of fans aligned along a first axis;
the open flow generator comprises a plurality of fans aligned along a second axis; and
the first axis and the second axis are perpendicular.

12. The display device of claim 1, wherein:
the closed flow generator is disposed at a first side of the display device;
the open flow generator is disposed at a second side of the display device; and
the first side and the second side are adjacent.

13. The display device of claim 1, wherein the closed flow generator comprises a plurality of fans configured to draw air from the first, second, and third spaces and into the closed heat exchange part.

14. The display device of claim 13, wherein the rear case comprises:
an upper bracket disposed above the closed heat exchange part and configured to permit air flow between the first, second, and third spaces and the closed heat exchange part; and
a lower bracket disposed below the closed heat exchange part and configured to permit air flow between the closed heat exchange part and the closed flow generator.

15. The display device of claim 14, wherein:
the rear case further comprises a front plate and a rear plate, wherein the upper bracket, the lower bracket, and the closed heat exchange part are disposed between the front plate and the rear plate; and
the front plate comprises:
an upper duct hole to permit air flow between the first, second, and third spaces and the upper bracket; and
a lower duct hole to permit air flow between the lower bracket and the closed flow generator.

* * * * *